US011735557B2

(12) United States Patent
Choi et al.

(10) Patent No.: US 11,735,557 B2
(45) Date of Patent: Aug. 22, 2023

(54) POWER MODULE OF DOUBLE-FACED COOLING

(71) Applicant: LG Electronics Inc., Seoul (KR)

(72) Inventors: Siho Choi, Seoul (KR); Seongmoo Cho, Seoul (KR); Kwangsoo Kim, Seoul (KR); Gun Lee, Seoul (KR)

(73) Assignee: LG MAGNA E-POWERTRAIN CO., LTD., Seoul (KR)

( * ) Notice: Subject to any disclaimer, the term of this patent is extended or adjusted under 35 U.S.C. 154(b) by 195 days.

(21) Appl. No.: 17/207,086

(22) Filed: Mar. 19, 2021

(65) Prior Publication Data

US 2021/0305193 A1   Sep. 30, 2021

(30) Foreign Application Priority Data

Mar. 26, 2020  (KR) ........................ 10-2020-0036951

(51) Int. Cl.
*H01L 23/00* (2006.01)
*H01L 23/373* (2006.01)
*H01L 25/065* (2023.01)

(52) U.S. Cl.
CPC .......... *H01L 24/29* (2013.01); *H01L 23/3733* (2013.01); *H01L 23/3735* (2013.01);
(Continued)

(58) Field of Classification Search
CPC ... H01L 24/33; H01L 23/3733; H01L 21/565; H01L 25/072; H01L 24/83; H01L 24/29; H01L 23/3735; H01L 24/32; H01L 23/5385; H01L 23/4334; H01L 23/3737; H01L 21/56; H01L 23/3732; H01L 25/0652; H01L 23/42; H01L 23/49816; H01L 23/53223; H01L 25/105; H01L 23/3736; H01L 23/481; H01L 23/373; H01L 23/49811; H01L 25/0655; H01L 23/3128; H01L 23/49827; H01L 25/18; H01L 23/49833; H01L 24/25; H01L 23/5382; H03K 3/3431; H03K 19/17728;
(Continued)

(56) References Cited

U.S. PATENT DOCUMENTS

| | | | |
|---|---|---|---|
| 2012/0020028 A1* | 1/2012 | Bachman | H01L 23/34 165/185 |
| 2014/0167263 A1* | 6/2014 | Wu | H01L 21/565 257/773 |

(Continued)

FOREIGN PATENT DOCUMENTS

| | | |
|---|---|---|
| JP | 2016146450 A | 8/2016 |
| KR | 101786343 B1 | 10/2017 |

*Primary Examiner* — Mouloucoulaye Inoussa
(74) *Attorney, Agent, or Firm* — Bryan Cave Leighton Paisner LLP

(57) ABSTRACT

A power module according implementations of the present disclosure includes a bonding layer for bonding two adjacent members. The bonding layer is formed by melting, applying, and solidifying a bonding material that has excellent thermal conductivity and electrical conductivity. The melted bonding material includes a plurality of anti-tilting members. The two members bonded during the process of solidifying the melted bonding material are supported by the plurality of anti-tilting members. This may allow tilting caused during the formation of the bonding layer to be suppressed.

20 Claims, 6 Drawing Sheets

(52) U.S. Cl.
CPC .............. *H01L 24/32* (2013.01); *H01L 24/33* (2013.01); *H01L 25/0655* (2013.01); *H01L 2224/29247* (2013.01); *H01L 2224/29355* (2013.01); *H01L 2224/29499* (2013.01); *H01L 2224/32225* (2013.01); *H01L 2224/32245* (2013.01); *H01L 2224/33181* (2013.01); *H01L 2224/83815* (2013.01); *H01L 2924/13055* (2013.01)

(58) Field of Classification Search
CPC ......... H03K 19/17736; H03K 19/0016; H03K 19/1776; H03K 19/018592; Y02P 70/50
USPC ......... 361/719; 257/774, 741, 773, E21.499; 438/122, 107; 165/185
See application file for complete search history.

(56) References Cited

U.S. PATENT DOCUMENTS

| | | | |
|---|---|---|---|
| 2014/0291830 A1* | 10/2014 | Hwang | H01L 25/50 257/686 |
| 2015/0155243 A1* | 6/2015 | Chen | H01L 24/83 438/107 |
| 2015/0162265 A1* | 6/2015 | Jo | H01L 25/50 257/774 |
| 2016/0113107 A1* | 4/2016 | Wang | H05K 3/3431 361/783 |
| 2016/0126204 A1* | 5/2016 | Kadoguchi | H01L 24/16 257/737 |
| 2016/0148820 A1* | 5/2016 | Lee | H01L 21/67126 269/21 |
| 2016/0255714 A1 | 9/2016 | Hiramitsu | |
| 2017/0154878 A1* | 6/2017 | Kim | H01L 25/50 |
| 2019/0214358 A1* | 7/2019 | Ha | H01L 24/11 |
| 2020/0006214 A1* | 1/2020 | Tsai | H01L 21/486 |
| 2020/0212006 A1* | 7/2020 | Chang | H01L 25/50 |
| 2020/0212018 A1* | 7/2020 | Lai | H01L 23/3121 |
| 2020/0219786 A1* | 7/2020 | Hung | H01L 23/3185 |
| 2020/0227380 A1* | 7/2020 | Kadoguchi | H01L 24/29 |
| 2021/0050300 A1* | 2/2021 | Lin | H01L 23/5386 |
| 2021/0118770 A1* | 4/2021 | Kuo | H01L 23/3737 |
| 2021/0257275 A1* | 8/2021 | Park | H01L 23/3675 |

\* cited by examiner

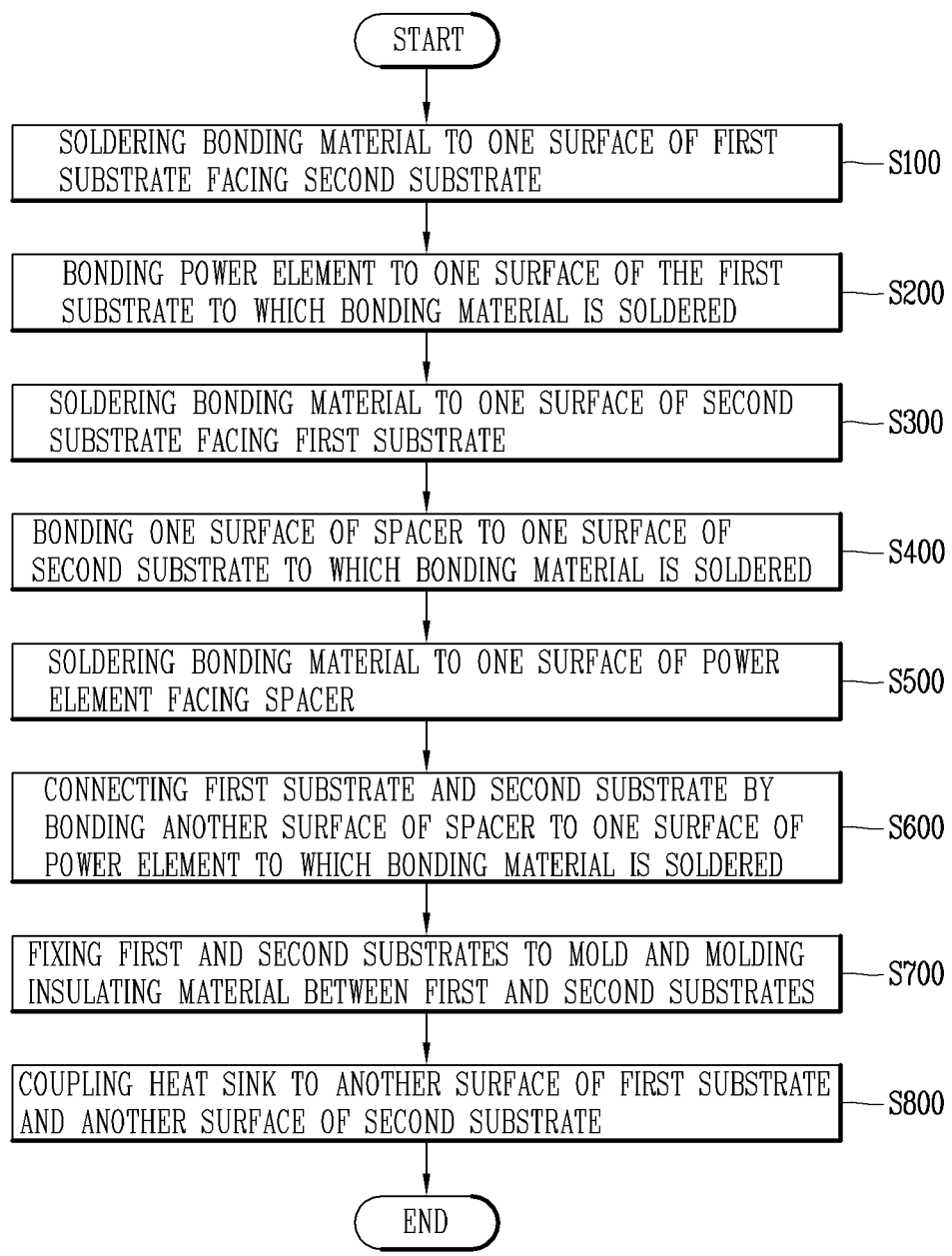

POWER MODULE OF DOUBLE-FACED COOLING

CROSS-REFERENCE TO RELATED APPLICATION

Pursuant to 35 U.S.C. § 119(a), this application claims the benefit of the earlier filing date and the right of priority to Korean Patent Application No. 10-2020-0036951, filed on Mar. 26, 2020, the contents of which are incorporated by reference herein in their entirety.

TECHNICAL FIELD

The present disclosure relates to a power module of double-faced cooling, and more particularly, to a power module of double-faced cooling capable of reducing assembly errors due to tilting caused during the assembly of the power module.

BACKGROUND

Home appliances such as compressors and air conditioners are provided with motors that convert electrical energy into driving energy. A motor may be driven by receiving power from an external power source of direct-current (DC) voltage.

In this case, the motor may be provided with an inverter that converts the DC voltage into a three-phase voltage. The inverter may include a power element or device that performs a switching operation, which is an operation of supplying power for driving the motor using supplied power.

A semiconductor device such as a gate turn-off thyristor (GTO) or an insulated gate bipolar transistor (IGBT) may be used as the power element.

When the power element performs a switching operation, thermal energy is generated in the power element, and accordingly, temperatures of the power element and a power module are increased. If the internal temperature of the power module is excessively increased, damage to the power element may occur. The damage to the power element may cause a decrease in the output of the motor, and furthermore, the operation of the motor may be stopped.

To prevent these problems, the power module is provided with a heat sink that is in contact with the power element to dissipate heat from the power element. The power module may have the heat sink on one surface or each of both surfaces.

As for a power element provided in a double-faced cooling type power module having heat sinks on both surfaces, the both surfaces of the power module are in contact with a thermal-conductive member, and heat generated from the power element is transferred to the heat sinks through the thermal-conductive member.

The power element and the thermal-conductive member may be bonded by a bonding layer interposed therebetween. The bonding layer may be formed by soldering or sintering a bonding material having thermal conductivity and electrical conductivity.

The power element and the thermal-conductive member are bonded to each other by melting the bonding material, and then coupled to each other during the process of solidifying the bonding material again.

However, since a difference in speed at which each portion of the bonding material is solidified may be caused, the bonding layer may be tilted when the power element and the thermal-conductive member are coupled to each other.

In addition, due to the tilting of the bonding layer, an assembly error of the power module may be caused.

Since the power module is a device that requires precise assembly, even a minute assembly error may lead to defects in the device.

For example, when the internal temperature of the power module is excessively increased, a problem that stress is intensively applied to a specific portion may occur. When the stress applied to the power element is excessively increased, the performance of the power element performing the switching operation may be deteriorated, and thus the power element may be damaged.

In addition, due to the tilting, a separation may occur between the heat sink and the thermal-conductive member. This may cause deterioration of heat dissipation performance of the power module.

The prior art document (Korean Registration Patent Publication No. 10-1786343) discloses a power module in which heat generated from a power element is dissipated to both side surfaces of a power element.

However, tilting may occur in the power module when the power element and a thermal-conductive member are bonded to each other, which may cause an excessive increase in stress in the power module and deterioration of heat dissipation performance, resulting in an excessive temperature rise.

That is, the prior art literature has a limitation in that there is no consideration for solving the problem that the tilting occurs upon coupling the power module.

PRIOR ART LITERATURE

Patent Literature

Korean Registration Patent Publication No. 10-1786343 (Oct. 18, 2017)

SUMMARY

The present disclosure is directed to providing a power module of double-faced cooling that has a structure capable of solving the above-described problems.

First, one aspect of the present disclosure is to provide a power module of double-faced cooling that can suppress tilting caused when a power element and a thermal-conductive member are coupled to each other.

Another aspect of the present disclosure is to provide a power module of double-faced cooling that can reduce an error during the assembly process of the power module.

Still another aspect of the present disclosure is to provide a power module of double-faced cooling that can suppress excessive stress from being applied to a specific portion of a power element.

Still another aspect of the present disclosure is to provide a power module of double-faced cooling that can prevent deterioration of heat dissipation performance of the power module.

In order to achieve these and other advantages and in accordance with the purpose of this specification, as embodied and broadly described herein, implementations disclosed herein provide a power module of double-faced cooling that may include a power element that performs a switching operation and a thermal-conductive material that is coupled to the power element.

The power element and the thermal-conductive member may be bonded to each other by a bonding layer having electrical conductivity and thermal conductivity.

The bonding layer may include an anti-tilting member having a predetermined height.

The anti-tilting member may be made of a material that does not melt during the process of melting the bonding layer. The anti-tilting member may be melted at a higher temperature than the bonding layer.

In addition, an error in height due to tilting caused during solidifying the bonding layer may be 20 μm or less.

The anti-tilting member may be provided in plurality, and the sum of cross-sectional areas of the plurality of anti-tilting members may be in the range of 20% to 25% of a cross-sectional area of the bonding layer.

Implementations disclosed herein also provide a power module of double-faced cooling that may include: a first substrate and a second substrate spaced apart from each other by a predetermined distance; a power element and a spacer sequentially disposed between the first substrate and the second substrate; and a plurality of bonding layers formed between the power element and the spacer, between the power element and the first substrate, and between the spacer and the second substrate, respectively.

At least one of the plurality of bonding layers may include a plurality of anti-tilting members, the plurality of anti-tilting members may each have a predetermined height in a direction that the first substrate and the second substrate face each other, and the anti-tilting members may be melted at a higher temperature than the plurality of bonding layers.

The bonding layers may each have a predetermined thickness in the direction that the first substrate and the second substrate face each other, and the predetermined height of the anti-tilting member and the predetermined thickness of the bonding layer may be equal to each other.

A difference between a shortest distance between the first substrate and the second substrate at one end of the first substrate and a shortest distance between the first substrate and the second substrate at another end of the first substrate opposite to the one end may be less than or equal to 20 μm.

Each of the plurality of anti-tilting member may have a spherical shape.

In addition, each of the plurality of anti-tilting members may have a column shape.

Each of the plurality of anti-tilting members may be made of nickel (Ni).

The sum of cross-sectional areas of the plurality of anti-tilting members, on a cross section passing through centers of the plurality of anti-tilting members, may be in the range of 20% to 25% of a cross-sectional area of the bonding layer.

Each of the plurality of bonding layers may have a polygonal cross section, and some of the plurality of anti-tilting members may be disposed at vertexes of the bonding layer.

In addition, each of the plurality of bonding layers may have a polygonal cross section, and some of the plurality of anti-tilting members may be disposed on a periphery of the bonding layer.

Implementations disclosed herein further provide a power module of double-faced cooling that may include: a first substrate and a second substrate spaced apart from each other by a predetermined distance; a power element disposed at one surface of the first substrate that faces the second substrate; a spacer disposed between one surface of the second substrate that faces the first substrate and the power element; and a plurality of bonding layers formed between the power element and the spacer, between the power element and the first substrate, and between the spacer and the second substrate, respectively.

At least one of the plurality of bonding layers may include a plurality of anti-tilting members, and the plurality of anti-tilting members may each have a predetermined height in a direction that the first substrate and the second substrate face each other.

Each of the plurality of bonding layers may be made of a material including copper (Cu), and each of the plurality of anti-tilting members may be made of nickel (Ni).

In addition, each of the plurality of anti-tilting members may have a spherical shape.

Each of the plurality of anti-tilting members may have a column shape.

Each of the plurality of bonding layers may have a polygonal cross section, and some of the plurality of anti-tilting members may be disposed at vertexes of the bonding layer, respectively.

The sum of cross-sectional areas of the plurality of anti-tilting members, on a cross section passing through centers of the plurality of anti-tilting members, may be in the range of 20% to 25% of a cross-sectional area of the bonding layer.

A difference between a shortest distance between the first substrate and the second substrate at one end of the first substrate and a shortest distance between the first substrate and the second substrate at another end of the first substrate opposite to the one end may be less than or equal to 20 μm.

According to implementations of the present disclosure, the following effects can be obtained.

First, a power element and a thermal-conductive member may be bonded to each other by a bonding layer. The bonding layer may include an anti-tilting member. The anti-tilting member may be melted at a higher temperature than a bonding material constituting the bonding layer.

Accordingly, the anti-tilting member may not be melted during the process of forming the bonding layer to thereby support the power element and the thermal-conductive member.

Thus, an occurrence of tilting due to a difference in speed at which different portions of the bonding layer are solidified may be suppressed.

This may allow an error in thickness of the bonding layer to be reduced, and prevent excessive stress from being applied to a specific portion of the power element when the internal temperature of the power module increases.

This may result in preventing heat dissipation performance from being deteriorated which is due to a separation between the thermal-conductive member and a heat sink.

Therefore, an error that can occur during the assembly process of the power module may be reduced.

BRIEF DESCRIPTION OF THE DRAWINGS

FIG. 9 is a flowchart illustrating a process of manufacturing a power module in accordance with one implementation of the present disclosure.

DETAILED DESCRIPTION

Hereinafter, a power module of double-faced cooling according to implementations of the present disclosure will be described in detail with reference to the accompanying drawings.

In the following description, descriptions of some components will be omitted in order to clarify the features of the present disclosure.

1. Definition of Terms

The term "electrical connection" may be used when one component is electrically connected to another component or is connected to enable information communication with another component. The electrical connection may be achieved by conducting wires, communication cables, or the like.

The terms "upper" and "lower" used in the following description refer to a direction toward a second substrate 40 and a direction toward a first substrate 30, respectively.

Figure 1:
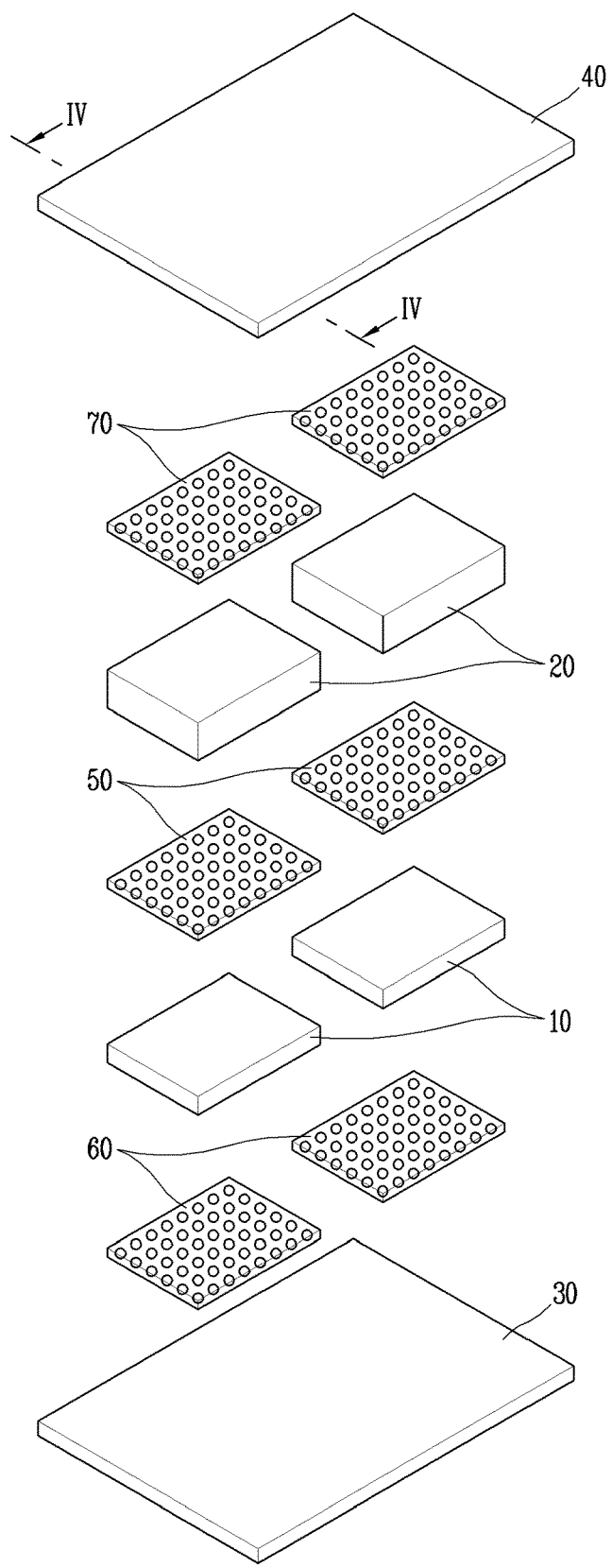
FIG. 1 is an exploded perspective view of a power module in accordance with an implementation of the present disclosure.

2. Description of Configuration of Power Module 1 According to One Implementation Referring to FIGS. 1, 2, and 4, a power module 1 that converts power supplied from an external power source (not illustrated) into a three-phase voltage is illustrated.

A power module 1 according to one implementation of the present disclosure may include a power element 10, a spacer 20, substrates 30 and 40, bonding layers 50, 60, and 70, an insulation part 80, and anti-tilting (or tilting prevention) members 100.

In some implementations, the power module 1 may include a semiconductor component such as a diode (not illustrated) in addition to the power element 10.

Hereinafter, each configuration of the power module 1 will be described in detail.

(1) Description of Power Element 10

The power element 10 may perform a switching operation, which is an operation of converting power supplied from an external power source into power for driving a motor and supplying the converted power.

A semiconductor device such as an insulated gate bipolar transistor (IGBT) may be used as the power element 10. However, the present disclosure is not limited thereto, and other known semiconductor devices may be used. For example, a gate turn-off thyristor (GTO) may be used as the power element 10.

In one implementation, the power element 10 may include electrodes formed on both surfaces thereof. For example, a gate electrode and an emitter electrode may be provided on an upper surface of the power element 10, and a collector electrode may be provided on a lower surface of the power element 10. Each electrode that may be provided on the power element 10 is a well-known technology, and thus a detailed description thereof will be omitted.

Since high power is required for the switching operation performed by the power element 10, high heat may be generated, compared to other general chips. When heat is excessively generated, damage to the power module 1 may occur. Therefore, a heat sink for dissipating heat generated from the power element 10 may be provided in the power module 1.

In one implementation, the heat sink may be implemented as a heat dissipation plate (not illustrated).

In order to dissipate heat from the power element 10 more efficiently, the power module 1 may have a double-faced (double-sided) cooling structure that dissipates heat to both sides of the power element 10.

In the double-faced cooling structure, the substrates 30 and 40 may be provided on upper and lower sides of the power element 10, and each of the substrates 30 and 40 may be coupled to a heat sink (not illustrated) for dissipating heat transferred from the power element 10 in a contact manner.

In addition, a spacer for securing an insulation distance between the substrates 30 and 40 may be provided.

(2) Description of Spacer 20

The spacer 20 may be connected to the power element 10 in a manner of facing one surface of the power element 10, and be used to keep the substrates 30 and 40 located on the upper and lower sides of the power element 10 apart.

Accordingly, an insulation distance between the substrates 30 and 40 may be secured.

The spacer 20 may have a predetermined height to achieve the insulation distance between the substrates 30 and 40, and be connected to the power element 10 in a manner that a lower surface thereof faces the upper surface of the power element 10.

More specifically, the spacer 20 may be disposed at a position that corresponds to an electrode formed on the upper surface of the power element 10. The spacer 20 may be connected to the substrate 40 in a manner that an upper surface thereof faces a lower surface of the substrate 40.

The spacer 20 may be formed of a material having excellent thermal conductivity and electrical conductivity. For example, the spacer 20 may be made of a material such as Al—Si—C or Cu.

Accordingly, the electrode formed on the upper surface of the power element 10 and a metal portion of the substrate 40 located at the upper side of the power element 10 may be electrically connected to each other through the spacer 20.

Further, heat generated from the power element 10 may be transferred to the substrate 40 located at the upper side of the power element 10 through the spacer 20.

A heat sink (not illustrated) may be coupled to an upper surface of the substrate 40 in a contact manner, so that heat transferred to the substrate 40 may be dissipated through the heat sink (not illustrated).

(3) Description of Substrates 30 and 40

The substrates 30 and 40 may be provided at the upper and lower sides of the power element 10, respectively. The first substrate 30 facing the lower surface of the power element 10 may be disposed at the lower side of the power element 10, and the second substrate 40 facing the upper surface of the spacer 20 may be disposed at the upper side of the power element 10.

That is, the first substrate 30 and the second substrate 40 may be spaced apart from each other by a predetermined distance with the power element 10 interposed therebetween.

Figure 2:
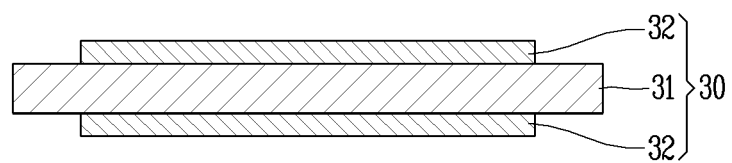
FIG. 2 is a cross-sectional view illustrating a substrate according to FIG.

Referring to FIG. 2, the first substrate 30 and the second substrate 40 may be implemented as insulating plates each having metal plates on both upper and lower surfaces thereof.

That is, the first substrate 30 may include a first insulating plate 31 and first metal plates 32 disposed on both upper and lower surfaces of the first insulating plate 31, and the second substrate 40 may include a second insulating plate 41 (see FIG. 4) and second metal plates 42 (see FIG. 4) disposed on both upper and lower surfaces of the second insulating plate 41.

The first insulating plate 31 and the second insulating plate 41 may be made of a material having high thermal conductivity and insulating properties. Accordingly, insulation between the first metal plates 32, and between the second metal plates 42 may be achieved while smoothly transferring heat generated from the power element 10.

The first metal plates 32 and the second metal plates 42 may be electrically connected to the power element 10 and the spacer 20 so as to transmit electrical signals generated from the power element 10.

The first metal plate 32 disposed on an upper surface of the first substrate 30 may be electrically connected to an electrode disposed on the lower surface of the power element 10. The first metal plate 32 disposed on the upper surface of the first substrate 30 may be located at a position corresponding to the electrode disposed on the lower surface of the power element 10.

In one implementation, the first metal plate 32 disposed on the upper surface of the first substrate 30 may be formed in various shapes according to the arrangement structure of the power element 10.

In addition, the second metal plate 42 disposed on the lower surface of the second substrate 40 may be electrically connected to the upper surface of the spacer 20. Here, the second metal plate 42 may be located at a position corresponding to the spacer 20.

In one implementation, the second metal plate 42 disposed on the lower surface of the second substrate 40 may have various shapes according to the arrangement structure of the spacer 20.

That is, the second metal plate 42 disposed on the lower surface of the second substrate 40 may be electrically connected to the electrode disposed on the upper surface of the power element 10.

The first substrate 30 and the second substrate 40 may be implemented as direct bonded copper (BDC) substrates. However, the present disclosure is not limited thereto, and may be implemented with various known substrates that can be used in the power module 1.

Heat sinks (or heat dissipation plates) (not illustrated) may be coupled to the lower surface of the first substrate 30 and the upper surface of the second substrate 40, respectively, in the contact manner. Accordingly, heat generated from the power element 10 may be dissipated to the heat sink through the first substrate 30. In addition, heat generated from the power element 10 may be dissipated to the heat sink through the spacer 20 and the second substrate 40.

With this configuration, heat generated from the power element 10 can be dissipated to both upper and lower surfaces of the power element 10.

Accordingly, heat dissipation performance of dissipating heat generated in the power element 10 may be improved.

This may result in suppressing an excessive increase in internal temperature of the power module 1 due to heat generation in the power element 10.

A bonding layer may be disposed between two members, facing each other, among the power element 10, the spacer 20, the first substrate 30, and the second substrate 40. The two members may be firmly coupled to each other by the bonding layer.

(4) Description of Bonding Layers 50, 60, and 70

The bonding layers (first, second, and third bonding layers) 50, 60, and 70 may bond (couple) two members facing each other.

The first bonding layer 50 may be disposed between the upper surface of the power element 10 and the lower surface of the spacer 20 so as to allow the power element 10 and the spacer 20 to be coupled to each other.

The second bonding layer 60 may be disposed between the lower surface of the power element 10 and the upper surface of the first substrate 30 so as to allow the power element 10 and the first substrate 30 to be coupled to each other.

The third bonding layer 70 may be disposed between the upper surface of the spacer 20 and the lower surface of the second substrate 40 so as to allow the spacer 20 and the second substrate 40 to be coupled to each other.

A bonding material having excellent thermal conductivity and electrical conductivity may be used for each of the bonding layers 50, 60, and 70, and each of the bonding layers 50, 60, and 70 may be formed by soldering or sintering.

Such bonding material that forms the bonding layers 50, 60, and 70 may include Ag, Cu, Sn—Cu, or the like.

(5) Description of Insulation Part 80

The insulation part 80 may be disposed between the first substrate 30 and the second substrate 40. The insulation part 80 may prevent insulation breakdown from occurring between the adjacent power elements 10 or between the first and second substrates 30 and 40.

The insulation part 80 may be formed by molding an insulating material between the first substrate 30 and the second substrate 40.

Hereinafter, with reference to FIGS. 3 to 5, a description will be given of the anti-tilting member 100 for suppressing the occurrence of tilting when assembling the power module 1 according to the present disclosure.

2. Description of Anti-Tilting Member 100

The power module 1 according to the implementation may include the anti-tilting member 100 in at least one of the bonding layers 50, 60, and 70.

The bonding layers 50, 60, and 70 may be formed through a process of melting a bonding material between two members to be bonded, and solidifying the melted bonding material. As the melted bonding material is solidified, the two members may be bonded to each other.

However, during the process of solidifying the melted bonding material, a difference may occur between a speed at which a portion of the melted bonding material is solidified and a speed at which another portion is solidified.

Accordingly, a difference in thickness between arbitrary two portions of the bonding layer may be increased.

As a result, two members that are bonded to each other by the bonding layer may be bonded at a predetermined angle. That is, one of the two members bonded to each other may be inclined with respect to the other member.

(1) Description of Problem Caused by Tilting

Figure 3:
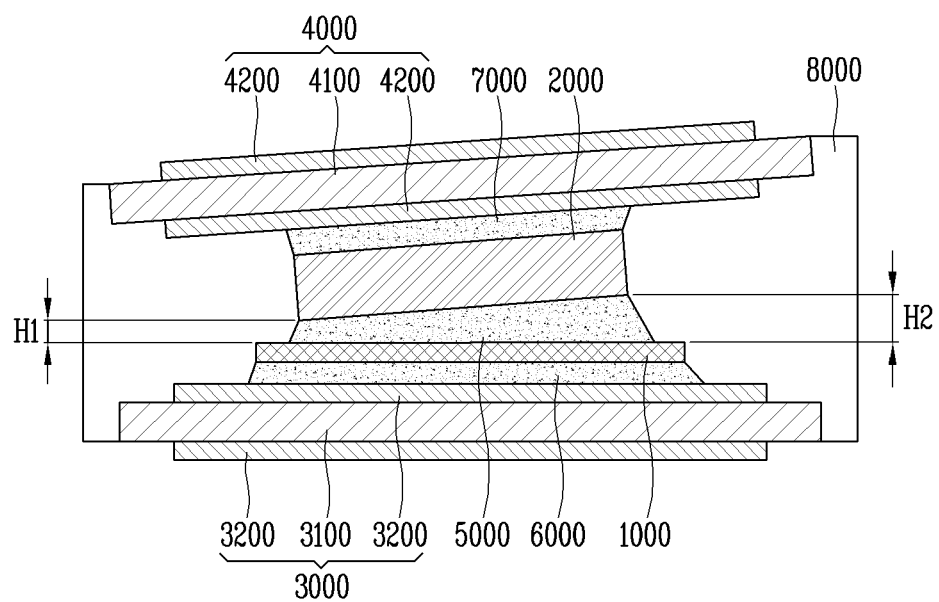
FIG. 3 is a cross-sectional view illustrating a power module of double-faced cooling according to the related art.

Referring to FIG. 3, a power module of the related art in a tilted state caused during the assembly process is illustrated.

The power module according to FIG. 3 includes a power element 1000, a spacer 2000, substrates (first and second substrates) 3000 and 4000, bonding layers 5000, 6000, and 7000, and an insulation part 8000.

Structures and functions of the components disclosed in FIG. 3 are the same as those of the power element 10, the spacer 20, the substrates 30 and 40, the bonding layers 50, 60, and 70, and the insulation part 80 according to the implementation of the present disclosure, so description thereof will be replaced with the above description.

The bonding layer 5000 illustrated in FIG. 3 is formed by solidifying a melted bonding material, and a difference may occur between a speed at which a portion of the melted bonding material is solidified and a speed at which another portion is solidified.

Accordingly, a difference in thickness between arbitrary two portions of the bonding layer may be increased.

As a result, the spacer 2000 and the power element 1000 that are bonded to each other by the bonding layer 5000 may be bonded at a predetermined angle.

In detail, when the first substrate 3000 that is coupled to the power element 1000 is disposed on the bottom surface and the spacer 2000 is bonded to an upper side of the power element 1000, the spacer 2000 that is coupled to the upper side of the power element 1000 may be inclined at a predetermined angle with respect to the power element 1000.

As illustrated, a left side of the bonding layer 5000 has a first thickness H1 and a right side thereof has a second thickness H2. The second thickness H2 is greater than the first thickness H1.

Accordingly, a distance between the spacer 2000 and the power element 1000 at the left side of the bonding layer 5000 having the first thickness H1 may be less than a distance between the spacer 2000 and the power element 1000 at the right side of the bonding layer 5000.

When the spacer 2000 thermally expands as an internal temperature of the power module increases, excessive stress may be temporarily applied to the left side of the power element 1000. That is, as thermal stress applied to the power element 1000 is unevenly or non-uniformly generated, excessive stress may be applied to a specific portion.

As a result, stress, which is higher than a stress value designed to be withstood or endured by the power element 1000, may be applied, causing damage to the power element 1000.

As the thicknesses of the left and right sides of the bonding layer 5000 varies, the spacer 2000 that is coupled to the upper side of the bonding layer 5000 may be coupled in a manner of being tilted from right to left.

As the spacer 2000 is tilted, the second substrate 4000 that is coupled to the spacer 2000 is also assembled in a tilted state.

As a result, the second substrate 4000 is assembled in the tilted state with respect to the first substrate 3000.

The insulation part 8000 is disposed between the first substrate 3000 and the second substrate 4000 that are coupled to each other. The insulation part 8000 is formed by fixing the first and second substrates 3000 and 4000 coupled to each other on a mold having a specific or predetermined shape, and then injecting an insulating material into the mold.

That is, the insulation part 8000 may be formed by a molding method.

When fixing the first substrate 3000 and the second substrate 4000, a lower surface of the first substrate 3000 and a lower surface of the second substrate 4000 are temporarily coupled to the mold.

However, when tilting between first substrate 3000 and the second substrate 4000 occurs, an assembly error with the mold may be caused.

Further, excessive stress may be applied to a specific portion of the power element 1000 by the mold. In detail, when the first substrate 3000 and the second substrate 4000 are temporarily fixed to the mold, excessive stress may be applied to a specific portion of the power element 1000. This may cause damage to the power element 1000.

Tilting caused by the difference in thickness of the bonding layer 5000 may also occur in the other bonding layers 6000 and 7000.

In detail, tilting may occur when the first substrate 3000 and the power element 1000 are coupled to each other, and tilting may occur when the second substrate 4000 and the spacer 2000 are coupled to each other.

Heat sinks (not illustrated) that dissipate heat generated in the power element 1000 may be coupled to the lower surface of the first substrate 3000 and an upper surface of the second substrate 4000, respectively, in the contact manner.

However, when the first substrate 3000 and the second substrate 4000 are assembled in a tilted state, a separation between the heat sink (not illustrated) and the first substrate 3000 and/or the heat sink (not illustrated) and the second substrate 4000 may occur.

Accordingly, an amount of heat transferred to the heat sinks (not illustrated) from the first substrate 3000 and the second substrate 4000 per unit hour may be reduced. Thus, heat dissipation performance of the power element 1000 may be reduced.

As a result, the internal temperature of the power module is excessively increased, causing damage to the power element 1000.

(2) Description of Anti-Tilting Structure According to Implementation

Figure 4:
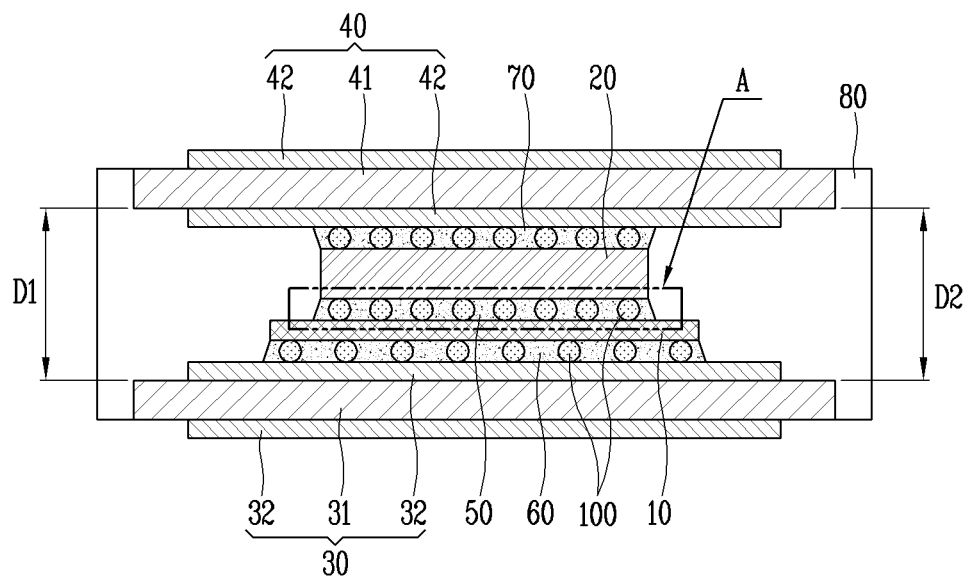
FIG. 4 is a cross-sectional view illustrating the power module according to FIG. 1, taken along line "IV-IV".

Referring to FIG. 4, in order to prevent problems caused by the tilting, the power module 1 according to the implementation may include an anti-tilting member 100 in at least one of the first bonding layer 50, the second bonding layer 60, and the third bonding layer 70.

The anti-tilting member 100 may be provided in plurality, each having a predetermined height in an up-and-down direction. The predetermined height may be designed in consideration of a thickness of each of the bonding layers 50, 60, and 70 in the up-and-down direction. That is, the anti-tilting member 100 may have a height equal to a design thickness of the bonding layers 50, 60, and 70.

The anti-tilting member 100 may have a spherical shape.

The plurality of anti-tilting members 100 may be disposed between two members to be bonded in a state of being contained in a melted bonding material. When the bonding material is solidified to form the bonding layer 50, 60, 70 containing the anti-tilting members 100, the anti-tilting members 100 may support the two members together with the bonding layer 50, 60, 70.

Taking the first bonding layer 50 as an example, the first bonding layer 50 may include the plurality of anti-tilting members 100, and the anti-tilting members 100 may support the power element 10 and the spacer 20 together with the first bonding layer 50 between the power element 10 and the spacer 20.

The anti-tilting member 100 may be made of a material that does not melt at a temperature at which the bonding material forming the bonding layer 50, 60, 70 is melted.

Accordingly, during the process of melting the bonding material, the anti-tilting members 100 may be disposed by being included in the melted bonding material without being melted.

In addition, the anti-tilting member 100 may be formed of a material that does not react with the bonding material while being included in the melted bonding material. If the anti-tilting member 100 is made of a material having too high reactivity, the anti-tilting member 100 may react with the bonding material and the shape of the anti-tilting member 100 may be melted.

When the anti-tilting member 100 is deformed, a height difference may occur between the plurality of anti-tilting members 100, and thus tilting may occur between the power element 10 and the spacer 20.

That is, the anti-tilting member 100 may be made of a material that has a higher melting point than the bonding material and does not react with the melted bonding material.

Accordingly, when the melted bonding material is solidified, the two members bonded may be supported by the anti-tilting members 100. For example, during the process of solidifying the bonding material forming the first bonding layer 50, the spacer 20 and the power element 10 may be supported by the plurality of anti-tilting members 100 interposed therebetween.

Thus, even when a difference in speed at which the bonding material is solidified at each portion occurs, the spacer 20 and the power element 10 may be supported by the plurality of anti-tilting members 100 interposed therebetween.

As a result, the spacer 20 and the power element 10 can be prevented from being coupled to each other in a tilted state.

The second bonding layer 60 may also include the plurality of anti-tilting members 100 so as to suppress the occurrence of tilting. More specifically, it can be suppressed that the first substrate 30 and the power element 10 are coupled to each other in a tilted state.

The third bonding layer 70 may also include the plurality of anti-tilting members 100 so as to suppress the occurrence of tilting. More specifically, it can be suppressed that the second substrate 40 and the spacer 20 are coupled to each other in a tilted state.

In one implementation, the bonding layers 50, 60, and 70 may be made of a material including copper (Cu).

In one implementation, the bonding layers 50, 60, and 70 may be made of a tin-copper alloy (Sn—Cu).

In one implementation, the anti-tilting member 100 may be made of a nickel (Ni) material.

Since the anti-tilting members 100 are included in the bonding layers 50, 60, and 70, respectively, the thickness of the bonding layers 50, 60, and 70 in the up-and-down direction may be within a predetermined error range.

In one implementation, the thickness of the bonding layers 50, 60, and 70 in the up-and-down direction may be within an error range of 7 μm.

In one implementation, a difference between the highest portion and the lowest portion of the bonding layers 50, 60, and 70 in the up-and-down direction (height direction) may be 20 μm or less.

Figure 5:
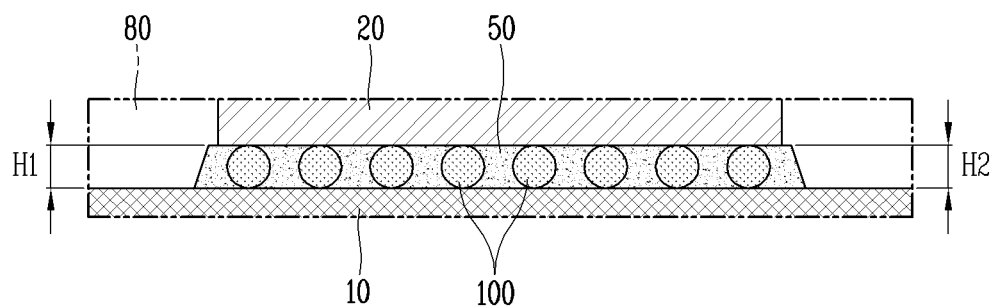
FIG. 5 is an enlarged partial cross-sectional view illustrating an area "A" of FIG. 4.

Referring to FIG. 5, a left side of the first bonding layer 50 may have a first thickness H1 and a right side thereof may have a second thickness H2. A difference between the second thickness H2 and the first thickness H1 may be a predetermined value or less, thereby improving reliability of the power module 1.

In one implementation, the difference between the second thickness H2 and the first thickness H1 may be 7 μm or less, thereby improving the reliability of the power module 1.

Not only the first bonding layer 50, but also the second and third bonding layers 60 and 70 may be formed such that the error in thickness is included within the predetermined error range.

In one implementation, a difference between the thickest portion and the thinnest portion of the bonding layers 60 and 70 may be 7 μm or less.

As the tilting that may occur in the bonding layers 50, 60, and 70 is suppressed, and the error in thickness is reduced, an assembly error of the entire power module 1 may be reduced.

A difference between the shortest distance between the first substrate 30 and the second substrate 40 at one end of the first substrate 30 and the shortest distance between the first substrate 30 and the second substrate 40 at another end of the first substrate 30 may be less than or equal to a predetermined value. In one implementation, the predetermined value may be less than or equal to 20 μm.

Referring back to FIG. 4, the difference between the shortest distance D1 between the first substrate 30 and the second substrate 40 at the left end of the first substrate 30 and the shortest distance D2 between the first substrate 30 and the second substrate 40 at the right end of the first substrate 30 may be 20 μm or less.

If the difference between the shortest distance between the first substrate 30 and the second substrate 40 at the one end of the first substrate 30 and the shortest distance between the first substrate 30 and the second substrate 40 at the another end of the first substrate 30 is excessively increased, the excessive increase in thermal stress and the deterioration in heat dissipation performance may occur.

In one implementation, if the difference between the shortest distance between the first substrate 30 and the second substrate 40 at the one end of the first substrate 30 and the shortest distance between the first substrate 30 and the second substrate 40 at the another end of the first substrate 30 is 100 μm or more, the problems such as the excessive increase in thermal stress and the deterioration in heat dissipation performance may occur.

In the power module 1 according to the implementation, the difference between the shortest distance D1 between the first substrate 30 and the second substrate 40 at the left end of the first substrate 30 and the shortest distance between the first substrate 30 and the second substrate 40 at the right end of the first substrate 30 is reduced to a predetermined value or less (preferably, 20 μm), the problems such as the excessive increase in thermal stress and the deterioration of the heat dissipation performance can be suppressed.

In other words, it may be possible to suppress stress, which is higher than or equal to a stress value designed to be withstood by the power element 10, from being produced on a specific portion of the power element 10 due to an increase in internal temperature of the power module 1.

That is, when assembling the first substrate 30 and the second substrate 40 to each other, the first substrate 30 and the second substrate 40 may form a predetermined angle that is extremely small. In one implementation, the first substrate 30 and the second substrate 40 may be coupled substantially in parallel to each other.

Accordingly, an error that may occur when assembling the first and second substrates 30 and 40 and the heat sinks (not illustrated) can be reduced. The thermal conduction performance between the first substrate 30 and/or the second substrate 40 and the heat sinks (not illustrated) can thusly be improved.

This may result in improvement of the heat dissipation performance of the power element 10.

In addition, when the first substrate 30 and the second substrate 40 are temporarily fixed to a mold, an assembly error can be reduced.

Therefore, excessive stress can be suppressed from being applied to a specific portion of the power element 10 by the mold.

Figure 6:
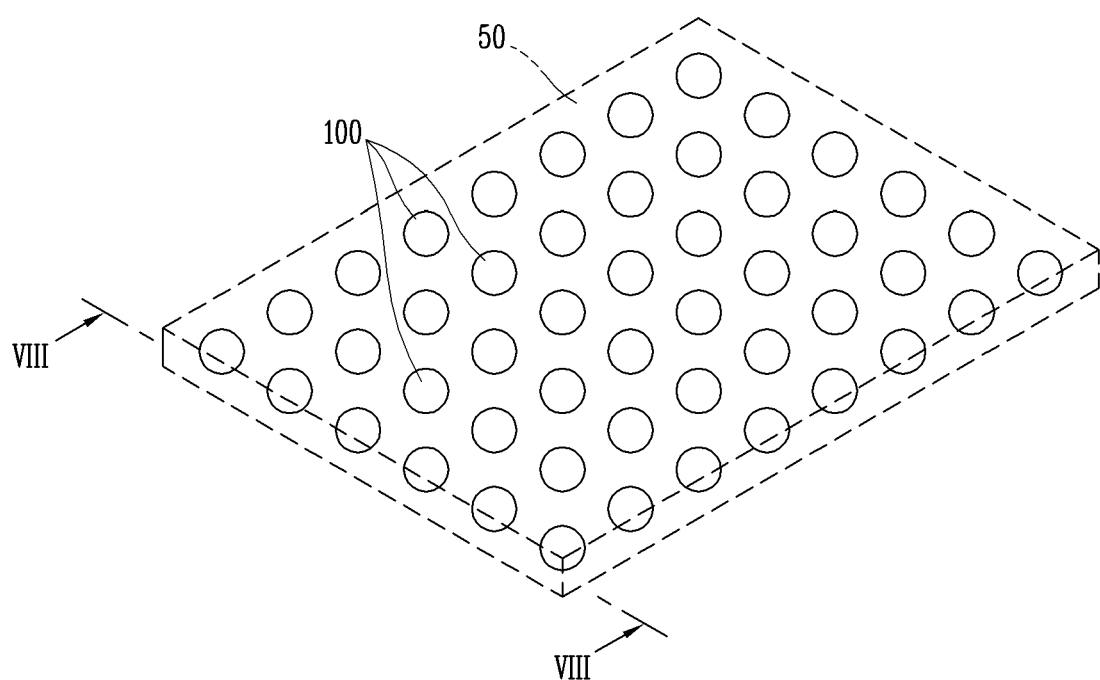
FIG. 6 is a perspective view illustrating a bonding layer according to FIG. 1.

(3) Description of Arrangement of Anti-Tilting Member 100 According to Implementation Referring to FIGS. 5 to 6, the plurality of anti-tilting members 100 may be evenly disposed in the entire first bonding layer 50.

The first bonding layer 50 may have a rectangular cross section, and some of the plurality of anti-tilting members 100 may be disposed at vertexes of the rectangle, respectively. Accordingly, when the spacer 20 and the power module 10 are coupled to each other, the spacer 20 may be prevented from being tilted with respect to the power module 10.

In some implementations, the first bonding layer 50 may have a polygonal cross section, and some of the plurality of anti-tilting members 100 may be disposed at vertexes of the polygon, respectively.

In addition, some of the plurality of anti-tilting members 100 may be disposed on a periphery of the first bonding layer 50. Accordingly, when the spacer 20 and the power element 10 are coupled to each other, the spacer 20 may be prevented from tilted with respect to the power element 10.

Although not illustrated, a plurality of anti-tilting members 100 included in the second bonding layer 60 and the third bonding layer 70 may also be disposed like the plurality of anti-tilting members 100 included in the first bonding layer 60.

The anti-tilting member 100 may have a spherical shape.

However, the present disclosure is not limited thereto, and the ant-tilting member 100 may alternatively be formed in a polygonal column shape having a predetermined height in an up-and-down direction.

Figure 7:
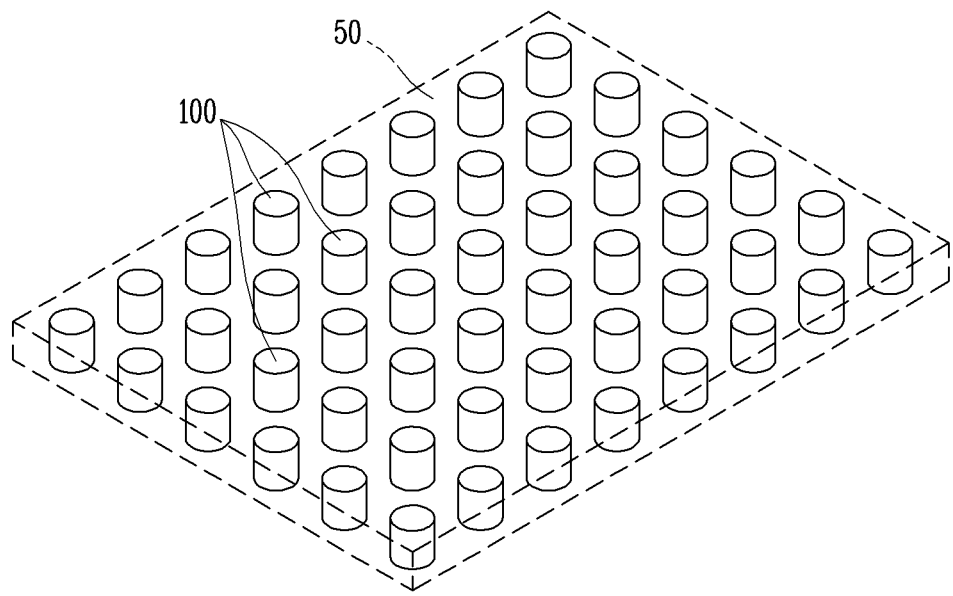
FIG. 7 is a perspective view illustrating another implementation of the bonding layer according to FIG. 6.

Referring to FIG. 7, the anti-tilting member 100 may have a cylindrical shape.

(4) Description of Area Ratio of Bonding Layer 50, 60, 70 and Anti-Tilting Member 100

In order to prevent an excessive reduction of bonding performance of the bonding layers 50, 60, and 70 and simultaneously to reduce an assembly error caused due to an occurrence of tilting, a mixing ratio of the bonding layer 50, 60, 70 and the plurality of anti-tilting members 100 may preferably be designed.

If the anti-tilting members 100 are excessively included in the bonding layer 50, 60, 70, the bonding performance of the bonding layer 50, 60, 70 may be reduced, which may cause reliability of the power module 1 to be lowered.

In addition, if an excessively small amount of anti-tilting members 100 is included in the bonding layer 50, 60, 70, the assembly error out of a designed assembly error range may occur.

Accordingly, the anti-tilting members 100 may preferably be included in the bonding layer 50, 60, 70 by an amount that is large enough to allow the assembly error of the power module 1 to be within the designed error range and to suppress the bonding performance of the bonding layers 50, 60, and 70 from being excessively deteriorated.

Figure 8:
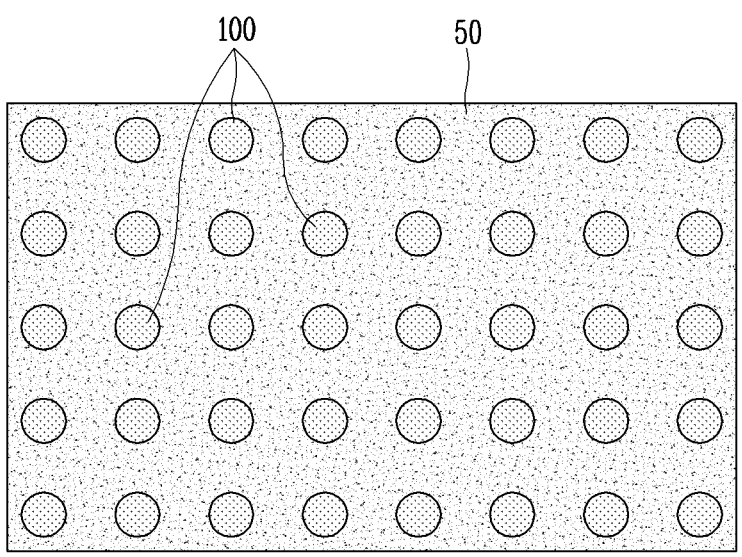
FIG. 8 is a cross-sectional view illustrating the bonding layer according to FIG. 6, taken along line "VIII-VIII".

Referring to FIG. 8, on a plane passing through centers of the plurality of anti-tilting members 100, a cross-sectional area of the first bonding layer 50 may be defined as a first area A1, and the sum of cross-sectional areas of the plurality of anti-tilting members 100 may be defined as a second area A2.

In one implementation, the second area A2 may be in the range of 20% to 25% of the first area A1.

Accordingly, the bonding performance of the first bonding layer 50 may not be excessively deteriorated, and the assembly error of the power module 1 may be within the designed error range.

3. Description of Method for Manufacturing Power Module 1 According to Implementation Referring to FIG. 9, a flowchart of a process of manufacturing the power module 1 according to an implementation of the present disclosure is shown.

(1) Description of Step (S100) of Soldering Bonding Material to One Surface of First Substrate 30 Facing Second Substrate 40

First, for bonding with the power element 10, a bonding material may be melted and applied to one surface of the first substrate 30. The bonding material may be a material having excellent thermal conductivity and electrical conductivity.

The bonding material may be soldered to positions corresponding to components to be mounted on the one surface of the first substrate 30.

The melted bonding material may contain the plurality of anti-tilting members 100.

By virtue of the anti-tilting members 100, an assembly error due to tilting of the power module 1 can be reduced.

The structure, arrangement, and function of the plurality of anti-tilting members 100 and the effects obtained by the reduction of the assembly error have been described above, and thus description thereof will be omitted.

The power element 10, diodes (not illustrated), lead frames (not illustrated), and the like may be mounted on the one surface of the first substrate 30.

The one surface of the first substrate 30 to which the melted bonding material has been applied may face the second substrate 40 that is disposed to be spaced apart from the first substrate 30 by a predetermined distance.

(2) Description of Step (S200) of Bonding Power Element 10 to One Surface of First Substrate 30 to which Bonding Material is Soldered The power element 10 may be placed on the melted and applied bonding material.

The power element 10 may be pressed with predetermined pressure toward the one surface of the first substrate 30. The predetermined pressure may be pressure designed for the bonding between the power element 10 and the first substrate 30.

In a state where the power element 10 and the first substrate 30 face each other, the melted bonding material may be solidified. Accordingly, the power element 10 and the first substrate 30 may be bonded to each other.

During the process of solidifying the bonding material, since the power element 10 and the first substrate 30 are supported by the plurality of anti-tilting members 100 interposed therebetween, the power element 10 may be prevented from being mounted in a tilted state with respect to the first substrate 30.

In addition to the power element 10, the diodes (not illustrated) and the lead frames (not illustrated) may also be mounted on the one surface of the first substrate 30 in the same manner.

The power element 10 mounted on the one surface of the first substrate 30 may be electrically connected to the first substrate 30.

(3) Description of Step (S300) of Soldering Bonding Material to One Surface of Second Substrate 40 Facing First Substrate 30

For bonding with the spacer 20, a bonding material is melted and applied to one surface of the second substrate 40.

The bonding material may be a material having excellent thermal conductivity and electrical conductivity.

The bonding material may be soldered to a position corresponding to the spacer 20 to be mounted on the one surface of the second substrate 40.

The melted bonding material may contain the plurality of anti-tilting members 100.

By virtue of the anti-tilting members 100, an assembly error due to tilting of the power module 1 can be reduced.

The structure, arrangement, and function of the plurality of anti-tilting members 100 and the effects obtained by the reduction of the assembly error have been described above, and thus description thereof will be omitted.

(4) Description of Step (S400) of Bonding One Surface of Spacer 20 to One Surface of Second Substrate 40 to which Bonding Material is Soldered The spacer 20 may be placed on the melted and applied bonding material.

The spacer 20 may be pressed with predetermined pressure toward the one surface of the second substrate 40. The predetermined pressure may be pressure designed for the bonding between the spacer 20 and the second substrate 40.

In a state where the spacer 20 and the second substrate 40 face each other, the melted bonding material may be solidified. Accordingly, the spacer 20 and the second substrate 40 may be bonded to each other.

During the process of solidifying the bonding material, since the spacer 20 and the second substrate 40 are supported by the plurality of anti-tilting members 100 interposed therebetween, the spacer 20 may be prevented from being mounted in a tilted state with respect to the second substrate 40.

The spacer 20 mounted on the one surface of the second substrate 40 may be electrically connected to the second substrate 40.

(5) Description of Step (S500) of Soldering Bonding Material to One Surface of Power Element 10 Facing Spacer 20

Through these steps, the power element 10 may be bonded to the one surface of the first substrate 30, and the spacer 20 may be bonded to the one surface of the second substrate 40.

For bonding between the first substrate 30 to which the power element 10 is bonded and the second substrate 40 to which the spacer 20 is bonded, a bonding material may be melted and applied to one surface of the power element 10. The bonding material may be a material having excellent thermal conductivity and electrical conductivity. The one surface of the power element 10 may be defined as a surface opposite to a surface that the power element 10 faces the first substrate 30.

The melted bonding material may contain the plurality of anti-tilting members 100.

By virtue of the anti-tilting members 100, an assembly error due to tilting of the power module 1 can be reduced.

The structure, arrangement, and function of the plurality of anti-tilting members 100 and the effects obtained by the reduction of the assembly error have been described above, and thus description thereof will be omitted.

(6) Description of Step (S600) of Connecting First Substrate 30 and Second Substrate 40 by Bonding Another Surface of Spacer 20 to One Surface of Power Element 10 to which Bonding Material is Soldered Another surface of the spacer 20 mounded on the second substrate 40 may be placed on the melted and applied bonding material.

The spacer 20 and the second substrate 40 may be pressed with predetermined pressure toward the one surface of the power element 10. The predetermined pressure may be pressure designed for the bonding between the spacer 20 and the power element 10.

In a state where the spacer 20 and the power element 10 face each other, the melted bonding material may be solidified.

Accordingly, the spacer 20 and the power element 10 may be bonded to each other.

As a result, the first substrate 30, the power element 10, the spacer 20, and the second substrate 40 are sequentially arranged to be assembled.

During the process of solidifying the bonding material, since the spacer 20 and the power element 10 are supported by the plurality of anti-tilting members 100 interposed therebetween, the spacer 20 may be prevented from being mounted in a tilted state with respect to the power element 10.

(7) Description of Step (S700) of Fixing First and Second Substrates 30 and 40 to Mold and Molding Insulating Material Between First and Second Substrates 30 and 40

After the first substrate 30, the power element 10, the spacer 20, and the second substrate 40 are assembled together, an insulating material may be molded between the first substrate 30 and the second substrate 40.

In a state where the assembled first and second substrates 30 and 40 are pressed and temporarily fixed to the mold, the insulating material may be applied between the first and second substrates 30 and 40 so as to form the insulation part 80.

As the insulation part 80 is formed, insulation internal pressure of the power element 10 may be secured. In addition, since the power element 10 is not exposed to outside, the power element 10 can be protected from the outside.

(8) Description of Step (S800) of Coupling Heat Sinks to Another Surface of First Substrate 30 and Another Surface of Second Substrate 40

Heat sinks (not illustrated) may be coupled to another surface of the first substrate 30 and another surface of the second substrate 40, respectively. The another surface of the first substrate 30 may be defined as a surface opposite to the one surface of the first substrate 30, and the another surface of the second substrate 40 may be defined as a surface opposite to the one surface of the second substrate 40.

Heat generated in the power element 10 may be dissipated through the spacer 20, the second substrate 40, and the heat sink.

In addition, heat generated in the power element 10 may be dissipated through the first substrate 30 and the heat sink.

That is, heat generated from the power element 10 may be dissipated to the both surfaces of the power element 10.

Accordingly, the heat generated in the power element 10 can be effectively dissipated.

Thus, an excessive increase in internal temperature of the power module 1 due to the heat generated from the power element 10 can be suppressed.

As a result, damage to the power element 10 which is caused due to the excessive increase in the internal temperature of the power module 1 can be suppressed.

In addition, since an assembly error that may occur in the power module 1 can be reduced by the plurality of anti-tilting members 100, the separation between the first and second substrates 30 and 40 and the heat sinks can be prevented.

Accordingly, heat transfer efficiency can be improved between the first and second substrates 30 and 40 and the heat sinks.

Therefore, the heat generated in the power element 10 can be effectively dissipated, and the damage to the power element 10 due to the excessive increase in the internal temperature of the power module 1 can be suppressed.

Although the foregoing description has been given with reference to the preferred implementations, it will be understood by those skilled in the art that various modifications and changes can be made without departing from the scope of the present disclosure disclosed in the following claims.

What is claimed is:

1. A power module, comprising:
    a first substrate and a second substrate separated by a predetermined distance in a first direction;
    a power element and a spacer disposed between the first substrate and the second substrate; and
    a first bonding layer formed between the power element and the spacer, a second bonding layer formed between the power element and the first substrate, and a third bonding layer formed between the spacer and the second substrate,
    wherein at least one of the first, second, and third bonding layers includes a plurality of anti-tilting members,
    wherein each of the plurality of anti-tilting members has a predetermined height in the first direction,
    wherein a melting temperature of the plurality of anti-tilting members is higher than a melting temperature of the first, second, and third bonding layers,
    wherein each of the first, second, and third bonding layers is formed by solidifying a melted bonding material, and
    wherein each of the plurality of anti-tilting members is formed of a material that does not react with the bonding material while being included in the melted bonding material.

2. The power module of claim 1, wherein each bonding layer has a predetermined thickness in the first direction, and
    wherein the predetermined height of each of the anti-tilting members and the predetermined thickness of each of the bonding layers are equal.

3. The power module of claim 1, wherein a difference between a distance between the first substrate and the second substrate at one end of the first substrate and a distance between the first substrate and the second substrate at another end of the first substrate opposite to the one end is less than or equal to 20 μm.

4. The power module of claim 1, wherein each of the plurality of anti-tilting members has a spherical shape.

5. The power module of claim 1, wherein each of the plurality of anti-tilting members has a column shape.

6. The power module of claim 1, wherein each of the plurality of anti-tilting members is made of nickel (Ni).

7. The power module of claim 1, wherein a sum of cross-sectional areas of the plurality of anti-tilting members, taken on a cross section passing through centers of the plurality of anti-tilting members, is 20% to 25% of a cross-sectional area of the bonding layer taken on the same cross section including the plurality of anti-tilting members.

8. The power module of claim 1, wherein each of the first, second, and third bonding layers has a polygonal cross section.

9. The power module of claim 8, wherein some of the plurality of anti-tilting members are disposed at vertexes of the bonding layer including the plurality of anti-tilting members.

10. The power module of claim 8, wherein some of the plurality of anti-tilting members are disposed on a periphery of the bonding layer including the plurality of anti-tilting members.

11. A power module, comprising:
    a first substrate and a second substrate separated by a predetermined distance in a first direction;
    a power element disposed at one surface of the first substrate that faces the second substrate;
    a spacer disposed between one surface of the second substrate that faces the first substrate and the power element; and
    a first bonding layer formed between the power element and the spacer, a second bonding layer formed between the power element and the first substrate, and a third bonding layer formed between the spacer and the second substrate,
    wherein at least one of the first, second, and third bonding layers includes a plurality of anti-tilting members,
    wherein each of the plurality of anti-tilting members has a predetermined height in the first direction,
    wherein each of the first, second, and third bonding layers is made of a material including copper (Cu),
    wherein each of the first, second, and third bonding layers is formed by solidifying a melted bonding material, and
    wherein each of the plurality of anti-tilting members is formed of a material that does not react with the bonding material while being included in the melted bonding material.

12. The power module of claim 11, wherein each of the plurality of anti-tilting members has a spherical shape.

13. The power module of claim 11, wherein each of the plurality of anti-tilting members has a column shape.

14. The power module of claim 11, wherein each of the first, second, and third bonding layers has a polygonal cross section.

15. The power module of claim 14, wherein some of the plurality of anti-tilting members are disposed at vertexes of the bonding layer including the plurality of anti-tilting members.

16. The power module of claim 14, wherein some of the plurality of anti-tilting members are disposed on a periphery of the bonding layer including the plurality of anti-tilting members.

17. The power module of claim 11, wherein a sum of cross-sectional areas of the plurality of anti-tilting members, taken on a cross section passing through centers of the plurality of anti-tilting members, is 20% to 25% of a cross-sectional area of the bonding layer taken on the same cross section including the plurality of anti-tilting members.

18. The power module of claim 11, wherein a difference between a distance between the first substrate and the second substrate at one end of the first substrate and a distance between the first substrate and the second substrate at another end of the first substrate opposite to the one end is less than or equal to 20 μm.

19. The power module of claim 11, wherein each bonding layer has a predetermined thickness in the first direction, and
    wherein the predetermined height of each of the anti-tilting members and the predetermined thickness of each of the bonding layers are equal.

20. The power module of claim 11, wherein each of the plurality of anti-tilting members is made of nickel (Ni).

\* \* \* \* \*